(12) United States Patent
Okuno

(10) Patent No.: US 6,668,013 B1
(45) Date of Patent: Dec. 23, 2003

(54) DIGITAL FILTER

(75) Inventor: Keizo Okuno, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/348,878

(22) Filed: Jul. 7, 1999

(30) Foreign Application Priority Data

Jul. 22, 1998 (JP) .......................................... 10-206941

(51) Int. Cl.[7] ................................................ H03H 7/30
(52) U.S. Cl. ...................... 375/229; 375/350; 708/300
(58) Field of Search ............................... 375/229, 230, 375/232, 346, 350, 348; 708/290, 300, 301, 313, 322, 323, 603

(56) References Cited

U.S. PATENT DOCUMENTS

| | | | | |
|---|---|---|---|---|
| 5,068,716 A | * | 11/1991 | Takayama et al. ........... | 348/708 |
| 5,383,144 A | | 1/1995 | Kato .......................... | 708/313 |
| 5,400,271 A | | 3/1995 | Himeno ...................... | 708/603 |
| 5,420,891 A | | 5/1995 | Akansu ....................... | 375/350 |
| 5,768,311 A | | 6/1998 | Betts et al. ................. | 375/222 |

FOREIGN PATENT DOCUMENTS

| | | |
|---|---|---|
| EP | 0653839 A1 | 5/1995 |
| JP | 59-105712 | 6/1984 |
| JP | 01-26204 | 5/1989 |
| JP | 2-257712 | 10/1990 |
| JP | 4-44410 | 2/1992 |
| JP | 6 46096 | 2/1994 |
| JP | 6-132780 | 5/1994 |
| JP | 06-303105 | 10/1994 |
| JP | 7-44422 | 5/1995 |
| JP | 8-139970 | 5/1996 |
| JP | 09-162699 | 6/1997 |
| JP | 09-232914 | 9/1997 |

* cited by examiner

Primary Examiner—Chieh M. Fan
(74) Attorney, Agent, or Firm—Birch, Stewart, Kolasch & Birch, LLP

(57) ABSTRACT

A digital filter of the present invention is an FIR type digital filter arranged such that an input data converting circuit samples input data at a rate N times as fast as a sampling frequency fs, and outputs the input data for a 1/N period of a sign interval T and "0" for the rest of the period. A changeover switch switches between an output from a take-out tap of actual input data and interpolation data obtained by an adding action of an adder circuit, and outputs the switched data as output data. Hence, even if the input data shape a rectangular wave pulse, a resulting state is equivalent to the one when an impulse train is inputted. Thus, since the impulse response characteristics of a roll-off filter can be utilized, outputs from each pair of taps supplied with the same coefficient are added to each other by an adder, and each addition result is multiplied by their respective coefficients by a multiplier. Consequently, the number of multipliers each composed of a large number of elements can be reduced. The digital filter of the present invention can be suitably used for a wireless communication device adopting the spectrum diffusion communication, and provided as a digital filter which can remove unwanted sideband of a digital signal with a simple arrangement.

16 Claims, 15 Drawing Sheets

FIG. 10 (a)

| ADDRESS | DATA |
|---|---|
| +85 | +42.5 |
| ... | ... |
| +51 | +25.5 |
| ... | ... |
| +17 | +8.5 |
| ... | ... |
| −17 | −8.5 |
| ... | ... |
| −51 | −25.5 |
| ... | ... |
| −81 | −42.5 |

CONVERSION TABLE

FIG. 10 (c)

| ADDRESS | DATA |
|---|---|
| 1 | +42.5 |
| 2 | +25.5 |
| 3 | +8.5 |
| 4 | −8.5 |
| 5 | −25.5 |
| 6 | −42.5 |

DIGITAL FILTER

FIELD OF THE INVENTION

The present invention relates to a digital filter which can be suitably applied for data communication, and more particularly, to a roll-off filter which can realize a Nyquist filter capable of eliminating intersymbol interference caused by filtering.

BACKGROUND OF THE INVENTION

Generally, it is known that a digital signal has quite a broad spectrum range for its data rate. For example, when a digital signal shown in FIG. 12(a) has a data rate of 1 Mbps, then its spectrum is spread as shown in FIG. 12(b).

On the other hand, a digital signal of images or sounds is transmitted by minutely dividing an available frequency bandwidth in accordance with its use or purposes. In order to send a large volume of information within limited frequency bandwidths, a data transferring rate may be improved, or the bandwidth of a signal having a certain data transferring rate may be narrowed, so that some portions of data are multiplexed by means of frequency dividing. In particular, in the field of a wireless communication, a radio wave source is effectively utilized by narrowing the bandwidth by suppressing an unwanted sideband of a base band signal.

However, when the bandwidth of a spectrum of the digital signal is narrowed, there occurs intersymbol interference, which possibly causes a bit error. In order to solve this problem, a Nyquist filter is extensively used as a filter which does not cause intersymbol interference even when the bandwidth is narrowed.

Characteristics of a roll-off filter R(f) which are given by Nyquist and realize a intersymbol-interference-free Nyquist filter are expressed as Equation below and illustrated in FIG. 13:

$$R(f) = \begin{cases} 1 & \cdots \quad 0 \leq |ft| \leq \frac{1-\alpha}{2} \\ \frac{1}{2}\left\{1 - \sin\left[\frac{\pi}{2\alpha}(2ft-1)\right]\right\} & \cdots \quad \frac{1-\alpha}{2} \leq |ft| \leq \frac{1+\alpha}{2} \\ 0 & \cdots \quad \frac{1+\alpha}{2} \leq |ft| \end{cases} \quad (1)$$

where T is a sign interval, and α is a roll-off ratio defined as 0≦α≦1. The roll-off filter R(f) has been well known as a filter functioning as the Nyquist filter, and in the explanation below, the Nyquist filter is referred to as the roll-off filter.

In FIG. 13, a capital letter W denotes a transition period. The transition period W is 0 when the filter characteristics are ideal α=0, and the larger the roll-off ratio α, the longer the transition period W. FIG. 13 shows the transition period when the roll-off ratio α is 0.5.

As shown in FIG. 13, by completing the transition from one sign to the other within a unit sign interval 1T, even there is an interference wave indicated by a broken line in FIG. 14(b), data indicated by a solid line, that is, sign data shown in FIG. 14(a), can be reproduced from data read out at predetermined reading points indicated by circles in FIG. 14(b). Consequently, filter characteristics necessary to establish a intersymbol-interference-free transmission path can be achieved.

Also, an impulse response r(t) of the roll-off filter R(f) is expressed as:

$$r(t) = \frac{\sin(\pi t/T)}{\pi t/T} \cdot \frac{\cos(\alpha t/T)}{1-(2\alpha t/T)^2}. \quad (2)$$

If the roll-off filter R(f) is supplied with a random impulse train δn (n= ..., −1, 0, 1, ...) having positive and negative polarities, then a resulting output is expressed as:

$$r_1(t) = \sum_{n=-\infty}^{\infty} \delta n r(t-nT). \quad (3)$$

If analog elements, such as L, C, and R, are used, a highly sophisticated design using a computer is required to achieve these filter characteristics. However, these characteristics can be achieved relatively easy if an FIR (Finite Impulse Response) filter using delay circuits each equipped with a tap or a non-cyclic filter known as a digital filter is used.

FIG. 15 is a block diagram depicting an electrical arrangement of a typical FIR type conventional digital filter 1. As shown in the drawing, the typical FIR type digital filter 1 comprises delay devices d1, d2, ..., dm cascaded in multiple stages, multipliers g0, g1, ..., gm, and an adder circuit 2. Input data x(n) are delayed sequentially by the delay devices d1 through dm. Here, the input and output of each of the delay devices d1 through dm are used as taps, and the data at each tap are multiplied by coefficients h0 through hm by the multipliers g0 through gm, respectively. All the multiplication results are added up by the adder circuit 2, whereby output data y(n) are obtained. For ease of explanation, marks representing multi-bit data are appended only to the input data x(n) and output data y(n), but it should be appreciated that the data processed in the digital filter 1 are also the multi-bit data.

With the above-arranged digital filter 1, the greater the number m of the taps, the more satisfactory the filter characteristics. However, if the number m of the taps is increased, the number of the delay devices d1 through dm and the number of elements forming the adder circuit 2 are increased as well. In addition, since the multipliers g0 through gm occupy a large mounting space, the entire circuit size is undesirably increased with an increasing number of the multipliers g0 through gm.

On the other hand, a wireless communication, particularly a spectrum diffusion communication, has been receiving a widespread attention in recent years because it can offer advantages as to confidentiality, a volume of transmission data, transmission power, etc. However, the spectrum diffusion communication requires various kinds of digital signal processing including modulation processing to append a diffusion signal to a transmission signal and decoding processing to remove the diffusion signal from a received signal.

Thus, with respect to the digital filters employed for a personal computer designed to transmit information by means of the spectrum diffusion communication through a wireless LAN or a communication unit incorporated in a portable device, there has been an increasing need to reduce the number of components and downsize the circuit to save the mounting space, costs, power consumption, etc. Even when circuit elements are replaced with integrated circuits to reduce the entire circuit size, it is advantageous to use a least necessary number of circuits from the view points of shortening a developing period and saving developing costs.

SUMMARY OF THE INVENTION

It is therefore an object of the present invention to provide a digital filter of a simple arrangement which can reduce the number of components and save costs and power consumption while shortening the developing period.

In order to fulfill the above and other objects, a digital filter of the present invention is furnished with:

(a) delay circuits, cascaded in multiple stages and each having a tap, for sequentially delaying actual input data;

(b) a plurality of first adding circuits for adding up outputs from the taps supplied with a same multiplying coefficient among multiplying coefficients used to multiply an output from each tap;

(c) a plurality of multiplying circuits for multiplying an output from each of the first adding circuits with their respective multiplying coefficients;

(d) a second adding circuit for adding up multiplication results from each of the multiplying circuits and outputting an addition result as interpolation data; and (e) an input data converting section for receiving a transfer clock having a frequency of N·fs, and converting the actual input data in such a manner that the actual input data are outputted to the delay circuits for a 1/N period of a sign interval T of the actual input data and "0" is outputted to the delay circuits for a remaining period, where N is a multiple of oversampling conducted by computing the interpolation data from the actual input data obtained by sampling input data for each sign interval T, and subsequently inserting the interpolation data into the actual input data, and fs represents a sampling frequency of the input data.

According to the above arrangement, the input data are inputted for a 1/N period of a sign interval T of the input data and "0" is inputted as the input data for the rest of the interval T. Thus, even when the input data shape a rectangle waveform pulse, a resulting state is identical with the one when an impulse train is inputted. Hence, since the impulse response characteristics of the roll-off filter can be utilized, a roll-off filter with optimal characteristics can be assembled with an arrangement such that the outputs from each pair of taps supplied with the same coefficient due to symmetry of the impulse response characteristics are added to each other, and each addition result is multiplied with their respective coefficients.

Consequently, since the number of elements, particularly the number of elements forming the multipliers can be reduced, the number of components can be reduced, and the costs and power consumption can be saved while the developing period can be shortened. Accordingly, the digital filter arranged in the above manner can be suitably used for a data communication device adopting the spectrum diffusion communication.

For a fuller understanding of the nature and advantages of the invention, reference should be made to the ensuing detailed description taken in conjunction with the accompanying drawings.

BRIEF DESCRIPTION OF THE DRAWINGS

FIGS. 10(a) through 10(c) are views explaining an operation of the digital filter of FIG. 9;

DESCRIPTION OF THE EMBODIMENTS

Referring to FIGS. 1 through 4, the following description will describe a first embodiment of the present invention.

Figure 1:
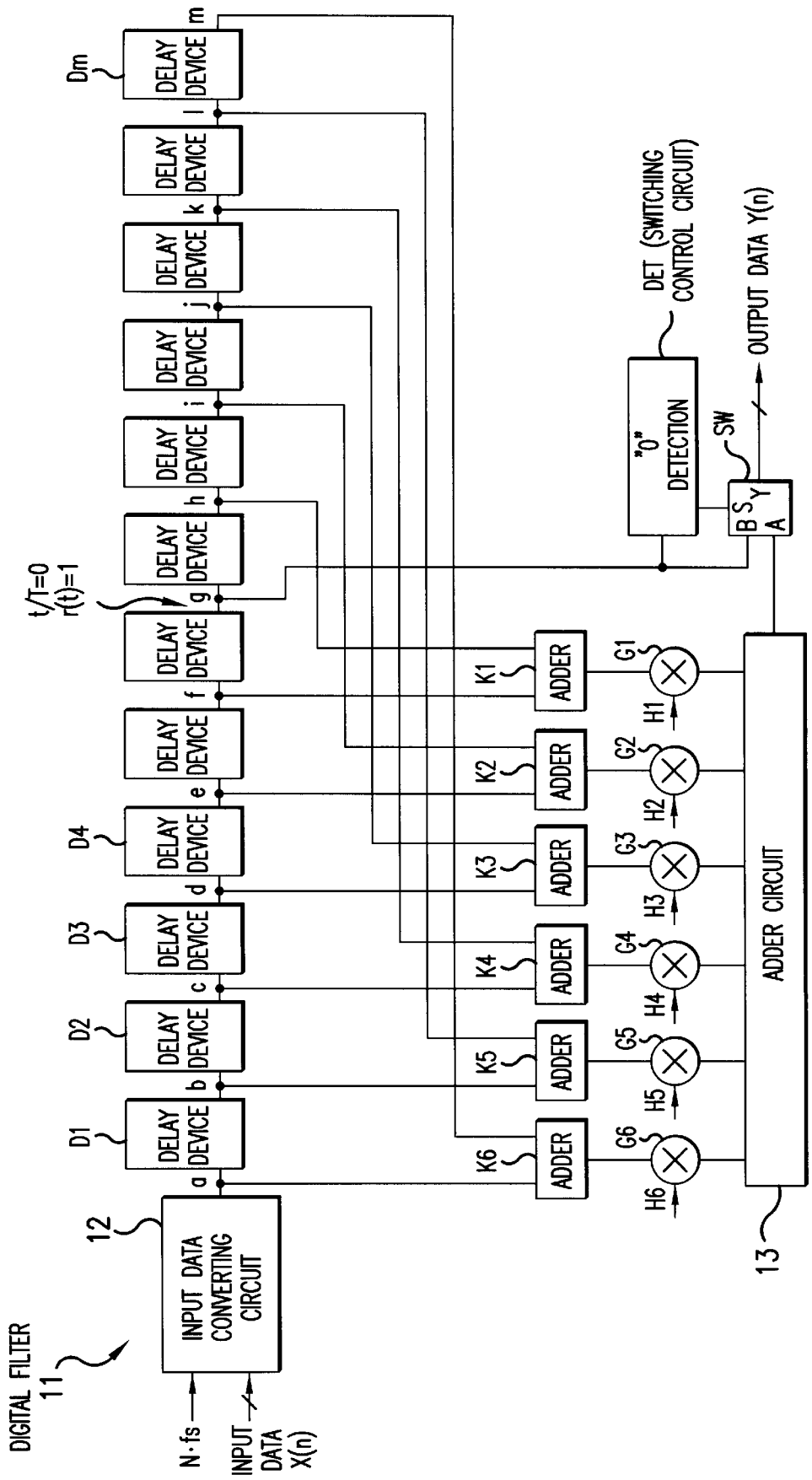
FIG. 1 is a block diagram depicting an electrical arrangement of a digital filter in accordance with a first embodiment of the present invention.

FIG. 1 is a block diagram depicting an electrical arrangement of a digital filter 11 in accordance with a first embodiment of the present invention. The digital filter 11 of the present invention is an FIR type digital filter, which comprises an input data converting circuit 12, delay devices D1, D2, . . . , Dm cascaded in multiple stages, (m is a multiple of 2, in case of FIG. 1, m=12, hereinafter, collectively represented by D), adders K1, K2, . . . , K(m/2) (hereinafter, collectively represented by K), multipliers G1, G2, . . . , G(m/2) (hereinafter, collectively represented by G), an adder circuit 13, a changeover switch SW, and a switching control circuit DET. Largely speaking, actual input data are obtained by sampling input data X(n) in every predetermined sign interval T, from which interpolation data are computed. Then, the interpolation data are inserted into the actual input data. This processing is known as oversampling, by which low-pass filtering is realized.

To be more specific, the input data X(n) are delayed sequentially by the delay devices D, and if it is assumed that the inputs and outputs of the delay devices D are taps a, b, . . . (in case of FIG. 1, up to m), then the data at the taps a, b, . . . are multiplied with coefficients H1 through H(m/2) (in case of FIG. 1, up to H6, hereinafter, collectively represented by H) by the multipliers G1 through G(m/2). The multiplication results are added up by the adder circuit 13, whereby the interpolation data are obtained. For ease of explanation, marks representing multi-bit data are appended only to the input data X(n) and output data Y(n), but it should be appreciated that the data processed in the digital filter 11 are also multi-bit data.

Notably in the present invention, given N as an oversampling multiple, then the input data converting circuit 12 inputs the input data X(n) directly to the delay device D1 in the first stage for 1/N period of the sign interval T, and inputs "0" for the rest of the period. For this reason, with respect to a sampling frequency fs of the input data X(n), a transfer clock having a frequency of N·fs is inputted into both the input data converting circuit 12 and delay devices D from an unillustrated clock signal source (pull-in lines of the transfer clock into the delay devices D are omitted in the drawing for ease of explanation).

Accordingly, as will be discussed below, even if the input data X(n) shape a rectangular wave pulse, a resulting state is identical with the one when an impulse train is inputted. Thus, the impulse response characteristics of the roll-off filter can be utilized. Here, outputs from two taps are multiplied with the same coefficient due to symmetry of the impulse response characteristics (in case of FIG. 1, pairs of taps: f,h;e,i;d,j; . . . , which are symmetrical with respect to the tap g from which non-interpolated actual input data are taken out). Then, the outputs from each symmetrical pair of taps are added to each other, and the sums are multiplied respectively with the coefficients H1, H2, . . . .

Figure 2:
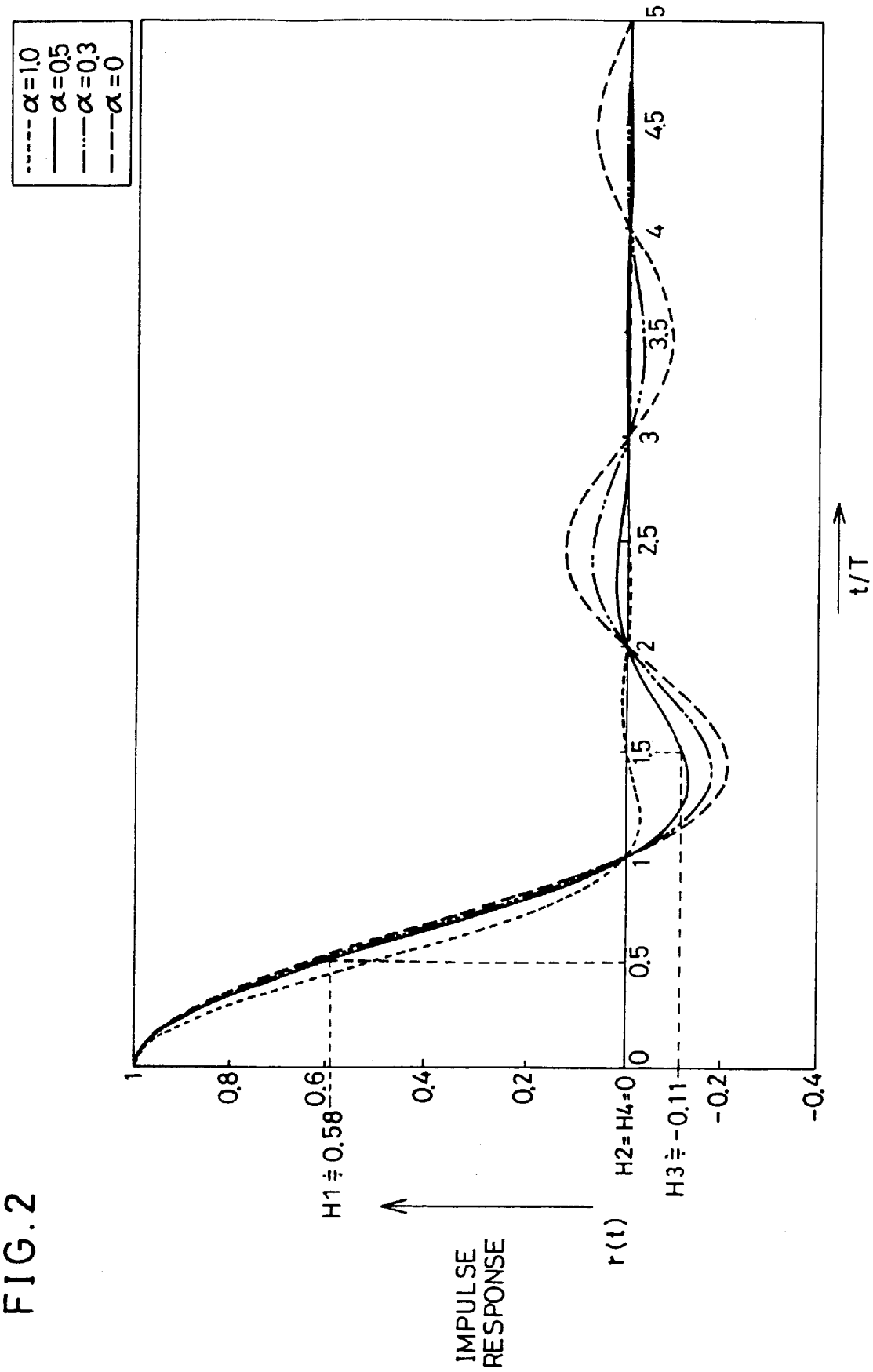
FIG. 2 is a graph showing an impulse response of a roll-off filter.

FIG. 2 is a graph showing a computation result to find impulse response r(t) in accordance with Equation 2 above by varying a roll-off ratio α from the intersymbol-interference-free filter characteristics given beforehand by Nyquist. The vertical axis indicates the level of impulse response, namely the coefficients, and the horizontal axis indicates a sampling cycle t normalized with the sign interval T. The next paragraph will describe how the coefficients H are found with reference to FIG. 2.

In the first place, an oversampling multiple N is determined. For example, given N=2, then by normalizing the sampling cycle t with the sign interval T (t/T), we get 0.5. Thus, the interpolation data obtained at t/T=0.5, 1.5, 2.5, . . . are inserted into the actual input data of the input data X(n) obtained at t/T=0, 1, 2, . . . . As has been explained, since the impulse response r(t) is symmetrical in time series, the levels of the impulse response r(t) at the timing r(+0.5)=r(−0.5), r(+1)=r(−1), . . . and so on.

Next, the roll-off ratio α is determined in such a manner that desired transmission characteristics are given to the digital filter 11. For example, given α=0.5, then the coefficients H1, H2, H3, . . . are the levels of the impulse response r(t), 0.58, 0, −0.11, . . . at the timings of t/T=±0.5, ±1, ±1.5, . . . , respectively. Alternatively, given N=3, then the coefficients H1, H2, . . . are the levels of the impulse response with a desired roll-off ratio at the timings of ±0.33, ±0.67, ±1, ±1.33, ±1.67, . . . , respectively.

It is understood from FIG. 2 that the coefficient at the take-out tap g of the actual input data is 1. In case that the remaining coefficients H1, H2, . . . can not be multiplied further with any other coefficient, the output from the tap g is directly outputted to the changeover switch SW.

In this manner, the outputs from each pair of taps, which are symmetrical with respect to the take-out tap g of the actual input data and supplied with the same multiplying coefficient, are added to each other first, and thence the sums are multiplied with their respective coefficients. Accordingly, the number of the multipliers G composed of a notably large number of transistors can be reduced to half. Hence, the number of components can be reduced, and the costs and power consumption can be saved while the developing period can be shortened. Therefore, the resulting digital filter can be suitably used for a data communication device adopting the spectrum diffusion communication.

Here, the job assigned to the adders K is the job assigned to the adding circuit 13. Hence, although the number of elements is increased by the number of the adders K, since the same number of elements can be omitted from the adder circuit 13, such an increase can be cancelled out.

Figure 3:
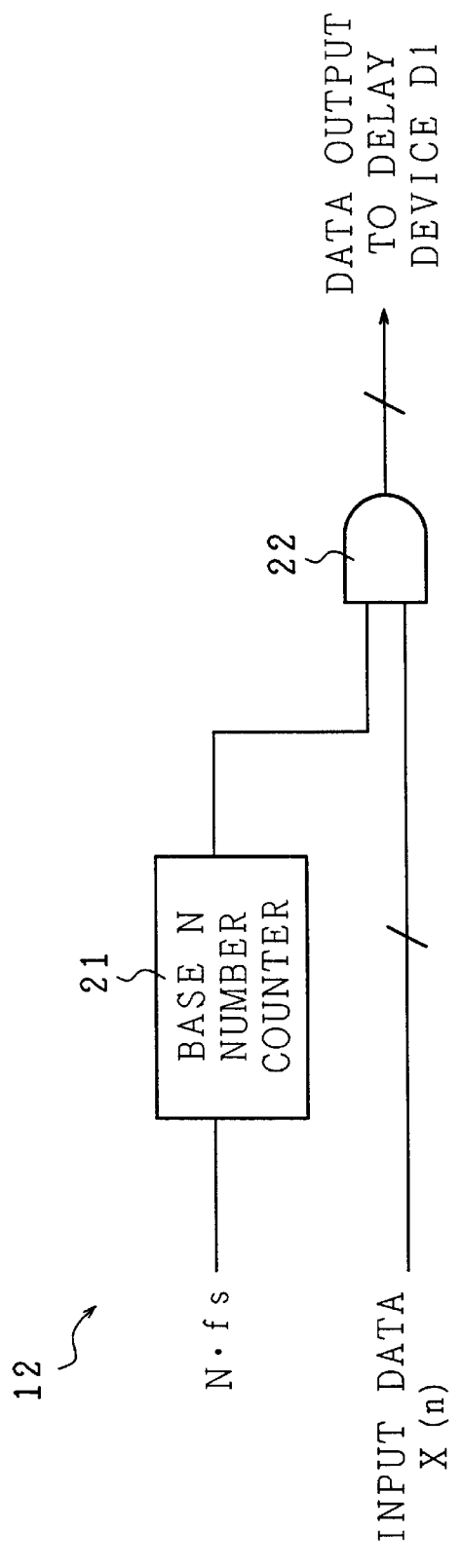
FIG. 3 is a block diagram depicting an arrangement of an input data converting circuit in the digital filter of FIG. 1.

FIG. 3 is a block diagram depicting an arrangement of the input data converting circuit 12. The input data converting circuit 112 is composed of a base N number counter 21 and an AND gate 22. The base N number counter 21 receives the transfer clock which is, as previously mentioned, N times as fast as the sampling frequency fs of the input data X(n), and outputs "1" to one of the inputs of the AND gate 22 each time it counts up the N transfer clocks. The other input of the AND gate 22 is supplied with the input data X(n). Thus, with the arrangement as simple as above, the input data X(n) are outputted from the AND gate 22 to the delay device D1 in the first stage for a T/N period, during which the AND gate 22 is receiving "1" from the base N number counter 21, and "0" is outputted to the same for the rest of the period. To be more specific, in case of N=3, the input data X(n) are outputted for ⅓ of the sign interval T, and "0" is outputted for the remaining ⅔ of the sign interval T.

Figure 4:
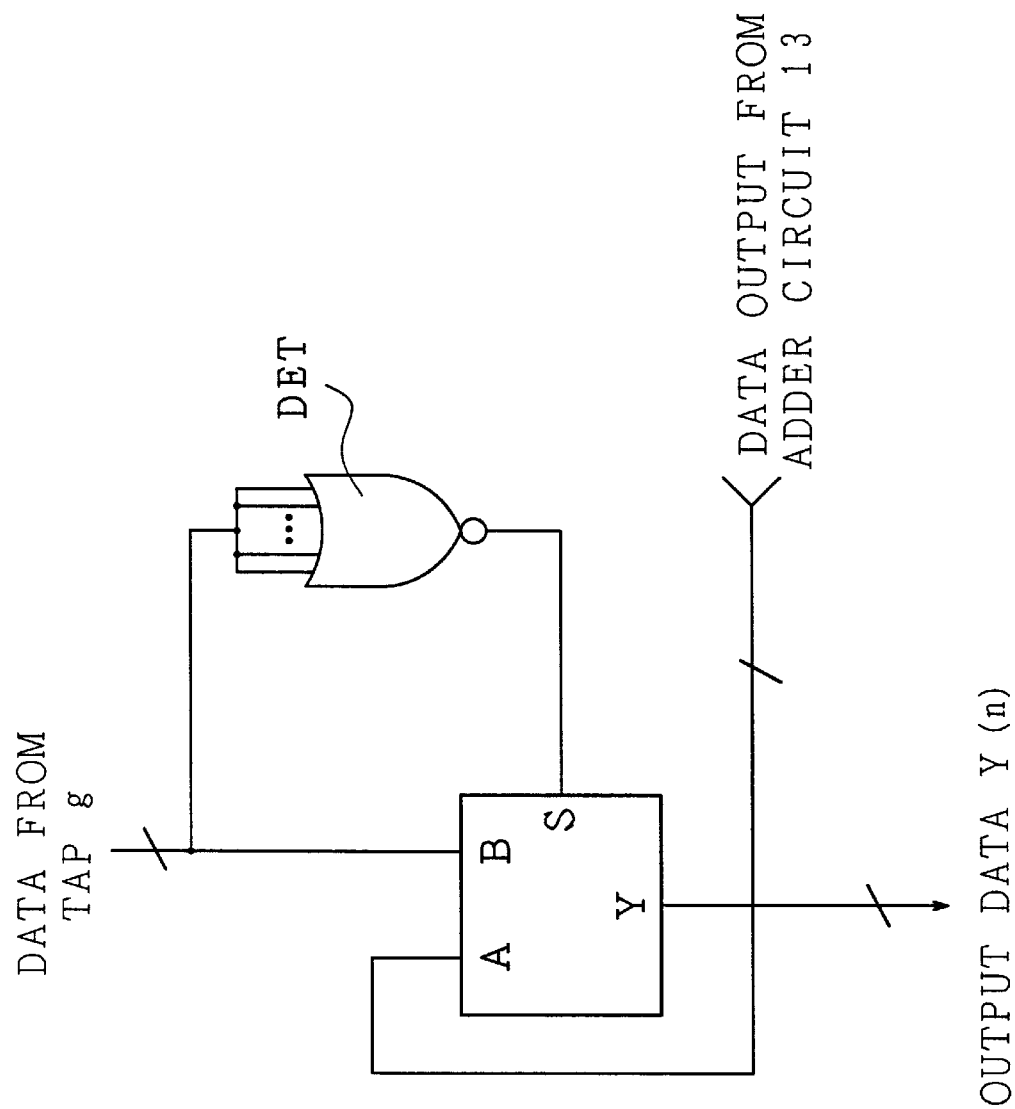
FIG. 4 is a block diagram depicting an arrangement of a switching control circuit in the digital filter of FIG. 1.

FIG. 4 is a block diagram depicting an arrangement of the switching control circuit DET. An example in the drawing is realized by a NOR gate having as many inputs as the bits of data. Although it will be described below, either the data from the tap g or the data from the adder circuit 13 are invariably "0". Thus, the switching control circuit DET monitors one of these data (input from the tap g in cases of FIGS. 1 and 4), and keep outputting "1" to the control terminal S of the changeover switch SW while the monitored data are "0". The input A of the changeover switch SW receives the data from the adder circuit 13 while the input B thereof receives the data from the tap g. The input at the input A side is introduced, to the output Y when the control terminal S shows "1", while the input at the input B side is introduced when the control terminal S shows "0". In this manner, by the actions of the switching control circuit DET and changeover switch SW, when there are actual input data, the actual input data are outputted as the output data Y(n); otherwise, the interpolation data are outputted.

As has been discussed above, with a simple arrangement using multipliers G composed of a less number of elements, the interpolation data, convoluted by the multiplying coefficients and outputted from the adder circuit 13, can be inserted into the actual input data outputted from the tap g, thereby realizing an N-times oversampling roll-off filter. Consequently, the number of the components can be reduced, and the costs and power consumption can be slaved while the developing period can be shortened. Particularly, in case of the spectrum diffusion communication device, by downsizing the circuit in the above manner, the digital filter can be incorporated into the transmitting section which carries out extensive signal processing and the baseband bandwidth can be narrowed. Thus, since a necessary bandwidth for each channel can be narrowed, a multi-channel communication which had been impossible by conventional methods has become available.

Figure 5:
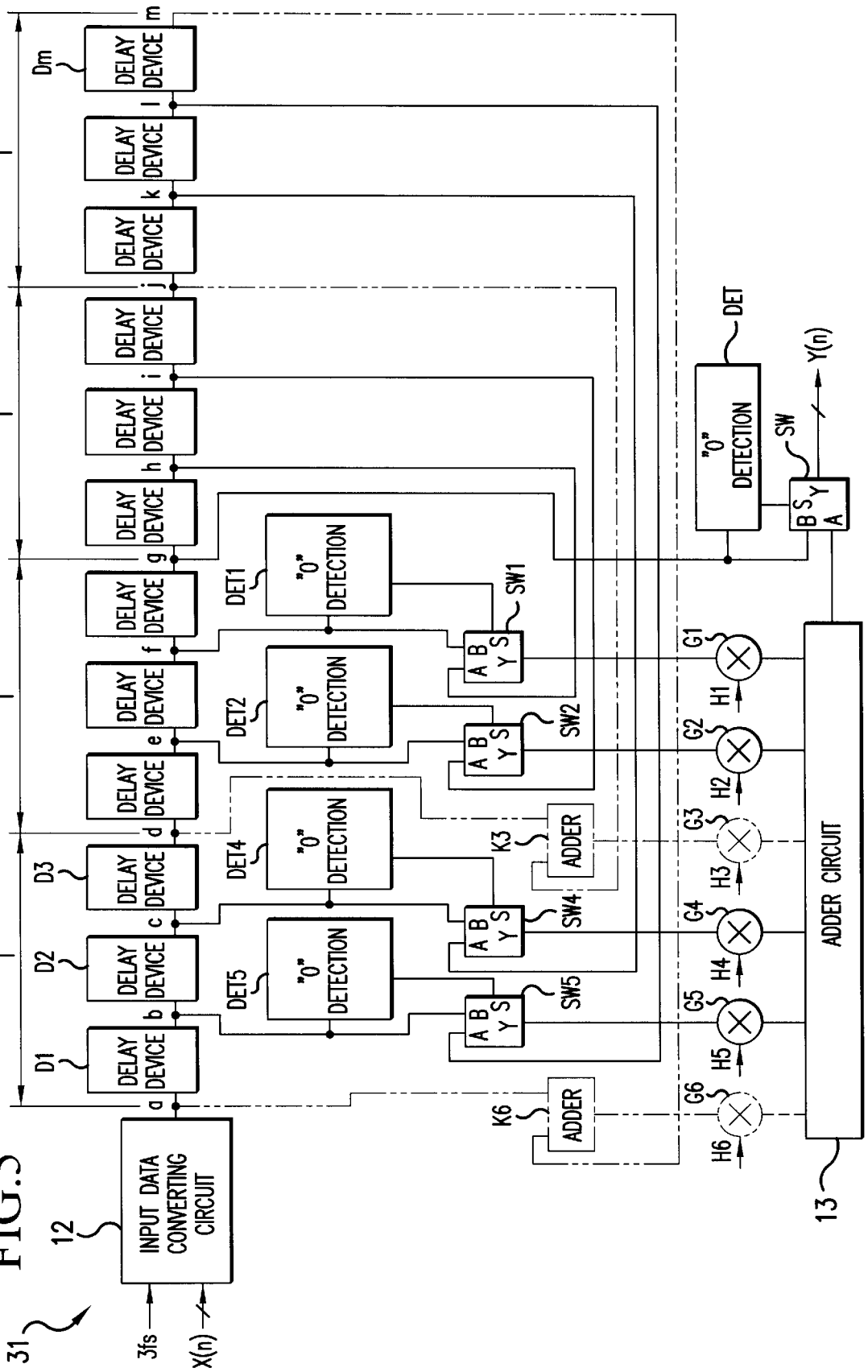
FIG. 5 is a block diagram depicting an electrical arrangement of a digital filter in accordance with a second embodiment of the present invention.
Figure 6:
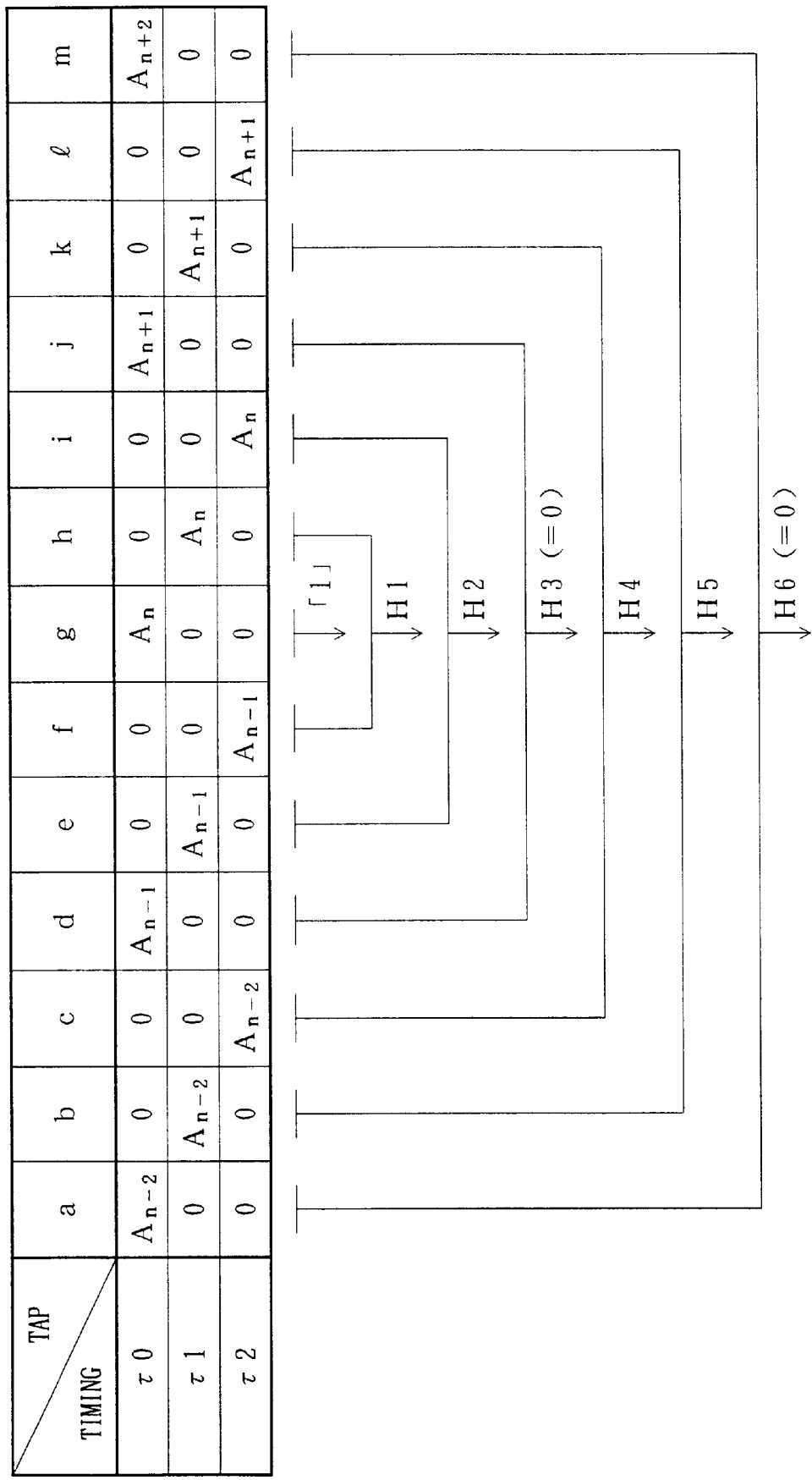
FIG. 6 is a view explaining an operation of the digital filter of FIG. 5.

Referring to FIGS. 5 and 6, the following description will describe a second embodiment of the present invention.

FIG. 5 is a block diagram depicting an electrical arrangement of a digital filter 31 in accordance with the second embodiment of the present invention. The digital filter 31 is a case using a multiple of an odd number as the oversampling multiple N. In case of the example in FIG. 5, N=3. Since the digital filter 31 is similar to the digital filter 11, like components are labeled with like reference numerals with respect to the digital filter 11, and the description of these components is not repeated for ease of explanation.

With reference to FIG. 6, the following will explain an operation of the 3-times oversampling digital filter 31. A table set forth at the upper half of FIG. 6 shows the data outputted from the taps a through m when the input data converting circuit 12 inputs the input data X(n) for ⅓ of the sign interval T, and "0" for the remaining ⅔ of the sign interval T. Assume that, at the reference timing τ0, data A(n) at the desired timing n are outputted to the take-out tap g of the actual input data.

Thus, at the timing τO, the data A(n−1) at one timing behind are outputted to the tap d which is 3 taps (=one sign interval T) ahead of the tap g, and the data A(n−2) at two timings behind are outputted to the tap a which is 6 taps ahead of the tap g. In contrast, the data A(n+1) at one timing ahead are outputted to the tap j which is symmetric to the tap d with respect to the tap g, and the data A(n+2) at two timing ahead are outputted to the tap m which is symmetric to the tap a with respect to the tap g.

Then, T/3 later, that is, at the timing τ1, the data at the taps a through l at the timing τ0 are transferred to the taps b through m, respectively, and in the meantime new data "0" are inputted to the tap a. Likewise, another T/3 later, that is, at the timing τ2, the data at the taps a through l at the timing τ1 are transferred to the taps b through m, respectively, and in the meantime new data "0" are inputted to the tap a.

It is understood from FIG. 2 that at the taps corresponding to t/T=±1, ±2, ..., the impulse response r(t) is "0", in other words, the multiplying coefficient is "0". Hence, in case of the 3-times oversampling digital filter 31 of FIG. 5, as shown in FIG. 6, there are data at the taps d and j both of which are 3 taps ahead and behind the take-out tap g of the actual input data and multiplied with the coefficient H3, and also at the taps a and m both of which are 6 taps ahead and behind the tap g and multiplied with the coefficient H6. However, since the coefficient H3 and H6 for the taps d and j and for the taps a and m are both "0", the adders K3 and K6 and the multipliers G3 and G6 associated with these taps are omitted in FIG. 5 and indicated by virtual lines.

As can be understood from FIG. 6, as to the taps b, c, e, f, h, i k, and l other than the aforementioned taps a, d, g , j, and m corresponding to t/T=0, ±1, ±2, there is no timing at which the data exist at both the symmetrical taps, for example, at the taps f and h. That is, either there are data at one of the symmetrical taps alone or there are no data at both the symmetrical taps. As shown in FIG. 5, the adders K1, K2, K4, and K5 associated with these pairs of taps f, h; e, i; c, h: b, l can be replaced with changeover switches SW1, SW2, SW4, and SW5 which are composed in the same manner as the changeover switch SW, of Embodiment 1 with a less number of elements than these adders. Also, in association with the changeover switches SW1, SW2, SW4, and SW5, are provided switching control circuits DET1, DET2, DET4, and DET5 which are arranged in the same manner as the switching control circuit DET of Embodiment 1.

Thus, as for the pairs of taps d and j and taps a and m which are nN'th taps (n is an integer) ahead and behind the take-out tap g of the non-interpolated actual input data, the adders K3 and K6 and the multipliers G3 and G6 can be omitted. Also, as for the pairs of taps f, h; e,i; c, h; b, l other than the foregoing nN'th taps, the adders K1, K2, K4, and K5 are replaced with the changeover switches SW1, SW2, SW4, and SW5 which are composed of a less number of elements than these adders. Consequently, the number of elements can be further reduced.

It is understood from FIG. 6 that, at the output timing τ0 of the actual input data from the tap g, the data are "0" at taps: in each of the pairs: f, h; e, i; c, k; b, l, supplied with the multiplying coefficients H1, H2, H4, and H5, respectively. On the other hand, there are data at the pairs of taps d, j; a m, supplied with the multiplying coefficients H3 and H6, respectively, but the multiplying coefficients H3 and H6 are "0". Hence, the data A(n) at the tap g are multiplied with a coefficient "1". In other words, only the original data have to be outputted directly. Thus, at the timing τO, the changeover switch SW is switched to output the data from the tap g directly, and therefore, no multiplier is necessary for the tap g.

Figure 7:
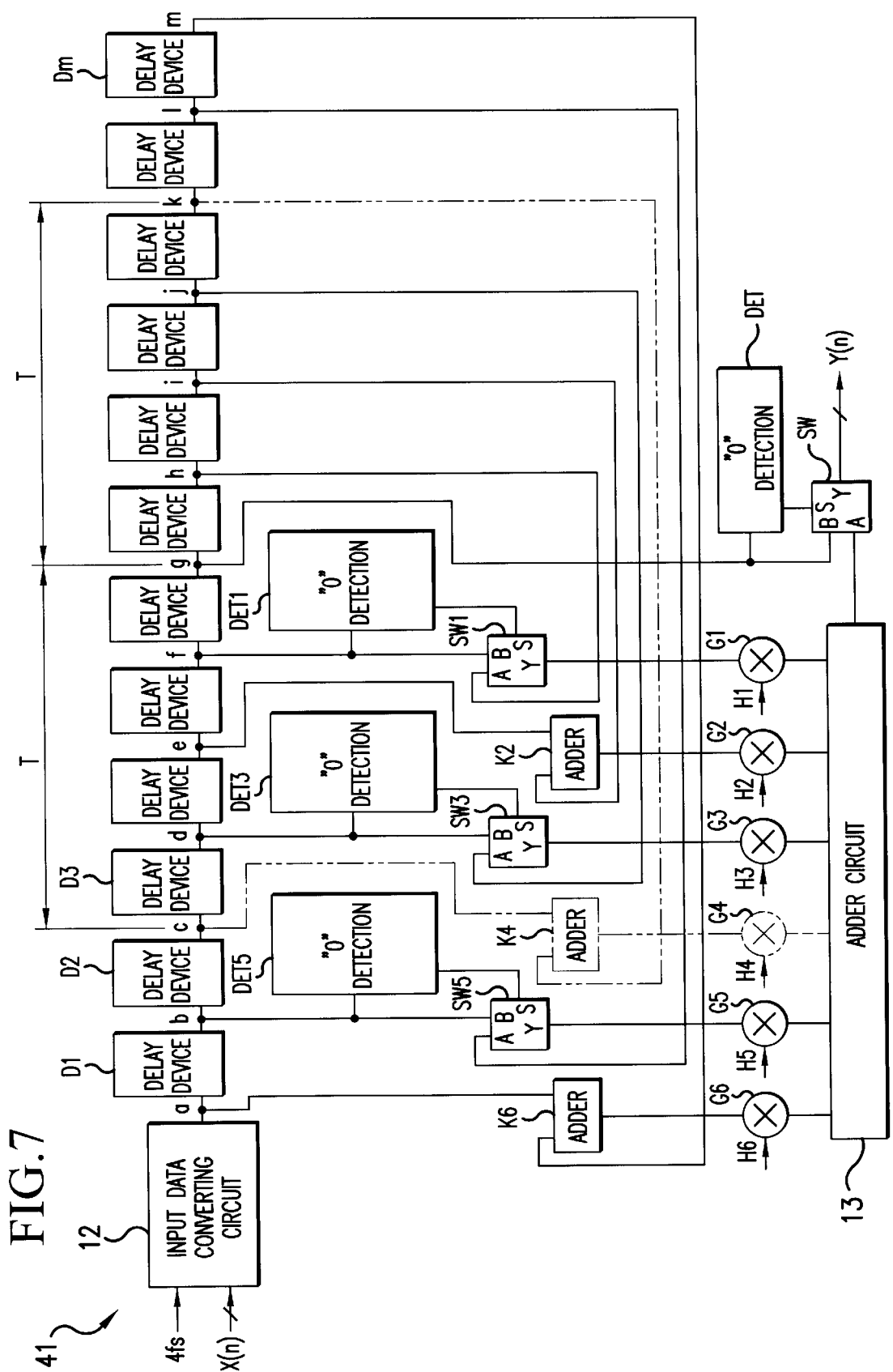
FIG. 7 is a block diagram depicting an electrical arrangement of a digital filter in accordance with a third embodiment of the present invention.
Figure 8:
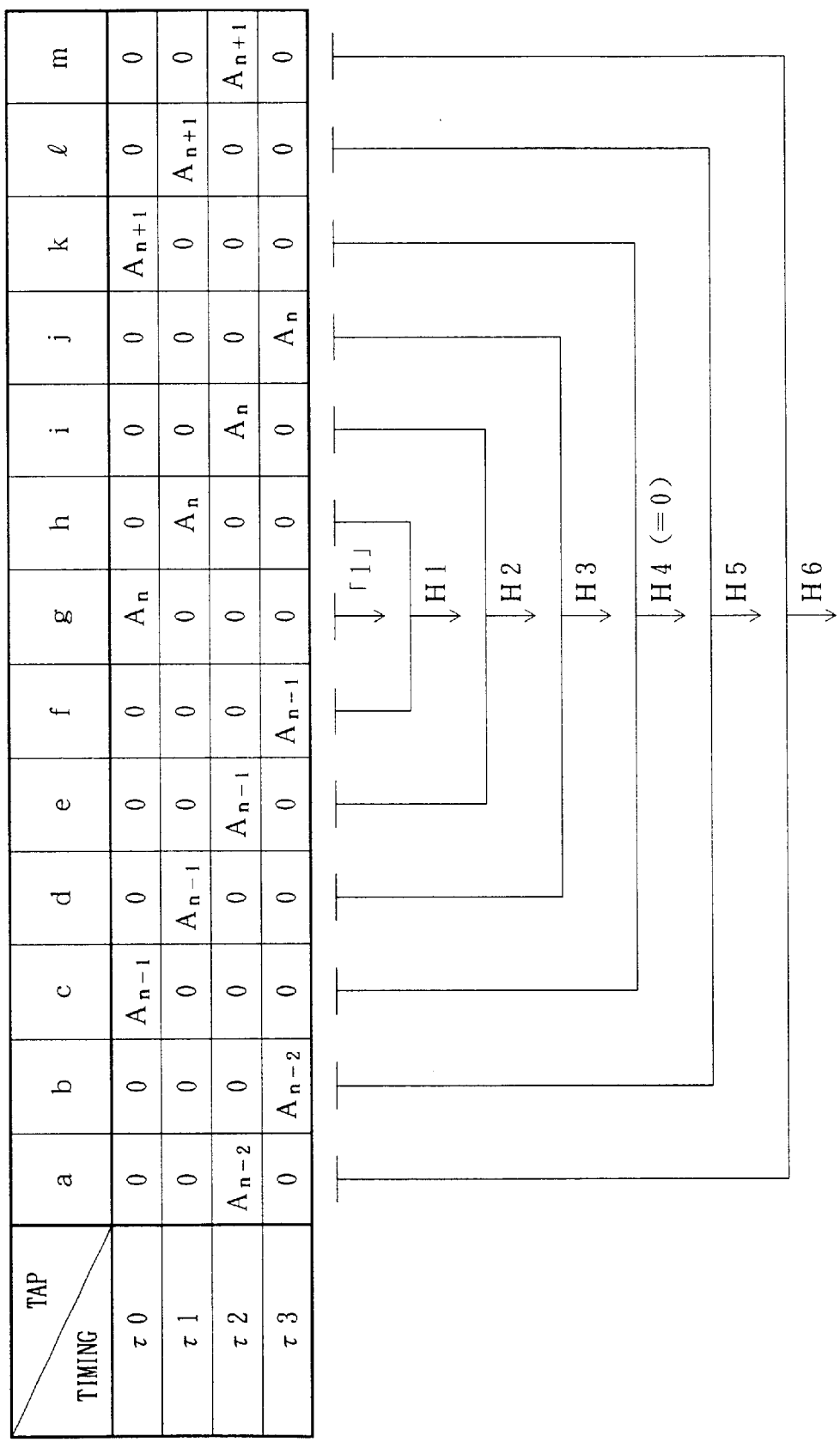
FIG. 8 is a view explaining an operation of the digital filter of FIG. 7.

Referring to FIGS. 7 and 8, the following description will describe a third embodiment of the present invention.

FIG. 7 is a block diagram depicting an electrical arrangement of a digital filter 41 in accordance with a third embodiment of the present invention. The digital filter 41 is an example using a multiple of an even number as the oversampling multiple N. In case of the example in FIG. 7, N=4. FIGS. 7 and 8 are similar to FIGS. 5 and 6, respectively, except that, for a pair of the taps c and k whose coefficient H4 is "0" at t/T=±1.0 (see FIG. 2), the adder K4 and multiplier G4 are omitted from the digital filter 41. For a pair of taps e and i corresponding to t/T=±0.5 and another pair of taps a and m corresponding to t/T=±1.5, the adder K2 and multiplier G2 and the adder K6 and multiplier G6 are left intact. However, for the remaining pairs of taps f,h;d, j;b,l, in which there are no data (0) at either or both of the taps, the adders K1, K3, and K5 are replaced with the changeover switches SW1, SW3, and SW5, respectively. Further, in association with the changeover switches SW1, SW3, and SW5, are provided the switching control circuits DET1, DET3, and DET5, respectively.

In this manner, even when the oversampling multiple N is an even number, the adder K4 and multiplier G4 associated with the taps c and k can be omitted, and the adders K1, K3, and KS can be replaced with the changeover switches SW1, SW3, and SW5, respectively. Consequently, the number of elements can be reduced further.

As shown in FIG. 8, in this case also, the data are "0" at both the taps in each of the pairs: f,h;e,i;d,j;b,l;a,m, which are supplied with the multiplying coefficients H1, H2, H3, H5, and H6, respectively. Further, there are data at both the taps c and k supplied with the multiplying coefficient H4, but the multiplying coefficient H4 is "0". Thus, like the case where the multiple N is an odd number, the data at the tap g only have to be outputted directly through the changeover switch SW, and therefore, no multiplier is necessary for the tap g.

Figure 9:
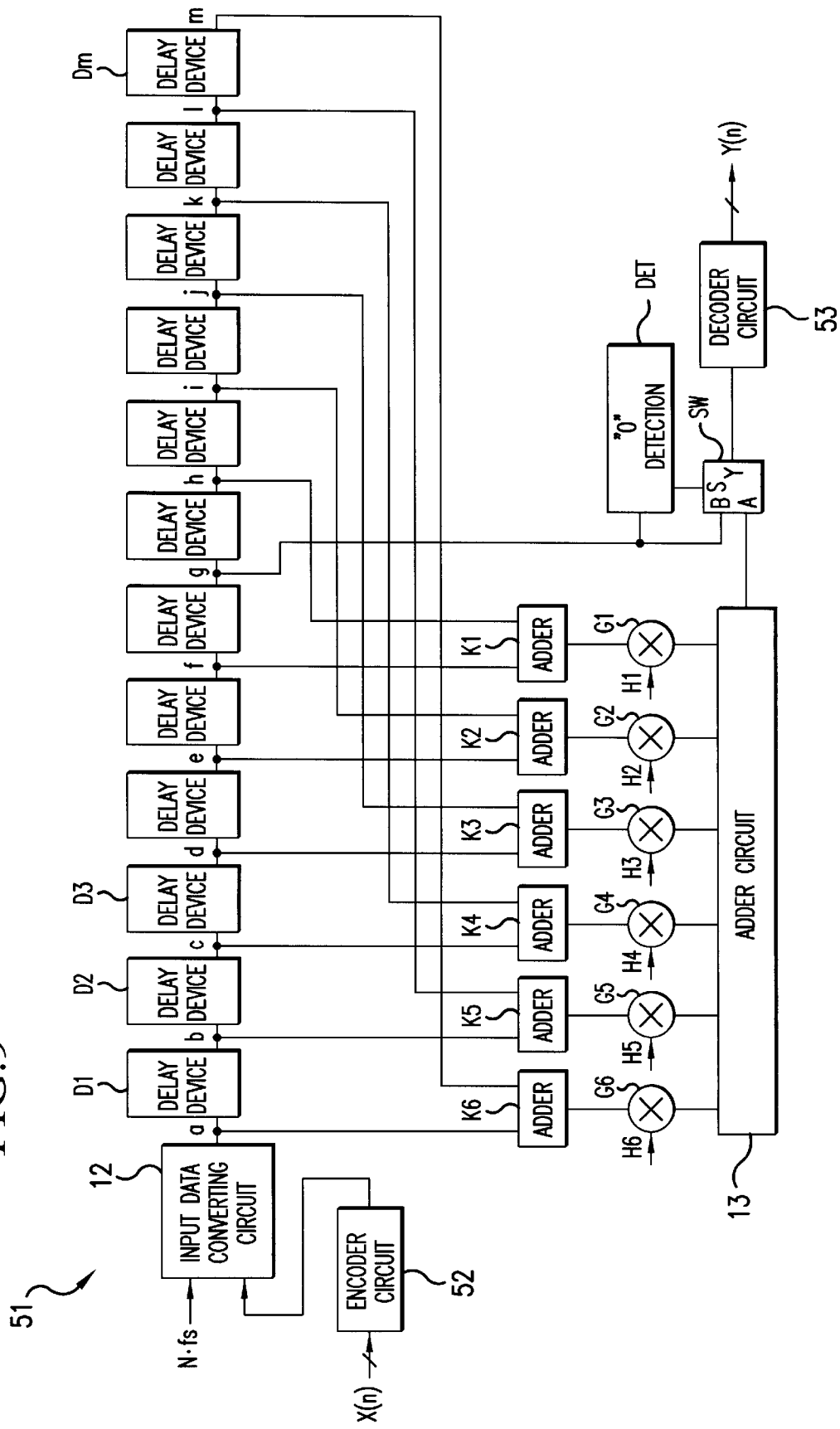
FIG. 9 is a block diagram depicting an electrical arrangement of a digital filter in accordance with a fourth embodiment of the present invention.

Referring to FIGS. 9 and 10, the following description will describe a fourth embodiment of the present invention.

FIG. 9 is a block diagram depicting an electrical arrangement of a digital filter 51 in accordance with a fourth embodiment of the present invention. The digital filter 51 is similar to the digital filter 11, and like components are labeled with like reference numerals with respect to the digital filter 11, and the description of these components is not repeated for ease of explanation.

The digital filter 51 operates on certain conditions that the input data X(n) and output data Y(n) are limited kinds of data, such as data modulated by means of 36 QAM (Quadrature Amplitude Modulation) or QPSK (Quadrature Phase Shift Keying) technique, so that the modulated data take a plurality of predetermined values alone. For this reason, an encoder circuit 52 is provided in the preceding stage of the delay device D1 in the first stage (in the example case of FIG. 9, the preceding stage of the input data converting circuit 12), while a decoder circuit 53 is provided at the succeeding stage of the changeover switch SW in the output stage.

Generally, in case of operational processing, if the input data X(n) are limited to a specific kind of data which take predetermined values alone as previously mentioned, the operational processing is carried out by storing the operation results in a storage area in each corresponding address as shown in FIG. 10(a) by using a table ROM, and reading out corresponding data by using the input data X(n) as address data. The example operational processing shown in FIG. 10(a) is a case where the input data are multiplied with a coefficient, 0.5. Also, in the example, the input data are the values which the aforementioned 64 QAM signal takes, that is, +85, +51, +17, −17, −51, and −85.

In the above cake, it is not necessary to store data in address areas where no input data are read out (indicated by diagonal lines in FIG. 10(a)). In the present embodiment, the encoder circuit 52 is composed of a conversion table which stores, as shown in FIG. 10(b), the above-specified 6 values as addresses and codes or numbers in their respective address areas. Whereas the decoder circuit 53 stores, as shown in FIG. 10(c), the code or number data as the address data and corresponding data in their respective address areas.

According to the above arrangement, the number of bits of the data processed in the digital filter 51 can be reduced.

Also, a capacity of the ROM table can be reduced in the following manner. That is, the aforementioned 6 different amplitude values can be digitally represented by only 3 bits ($2^3=8$). However, 6–8 bits are used in practical applications to secure a noise margin between every adjacent amplitudes and maintain satisfactory resolution for a DAC. Thus, assume that the amplitude values are represented by 8 bits, the data are 8-bit long (=1 byte), and 6 different coefficients are used, then a necessary ROM capacity is: $2^8 \times 1 \times 6 = 1536$ (byte). In contrast, by converting the amplitude values into 6 different codes or numbers in the above manner, a necessary ROM capacity can be reduced drastically to about $2^8/6 \approx 36$ (byte) (1/43), thereby making it possible to further reduce the number of elements.

In the above explanation and FIG. 10, the input and output data X(n) and Y(n) are represented by decimal numbers with plus and minus signs. However, it should be appreciated that these data and signs are processed in the form of binary numbers.

Figure 11:
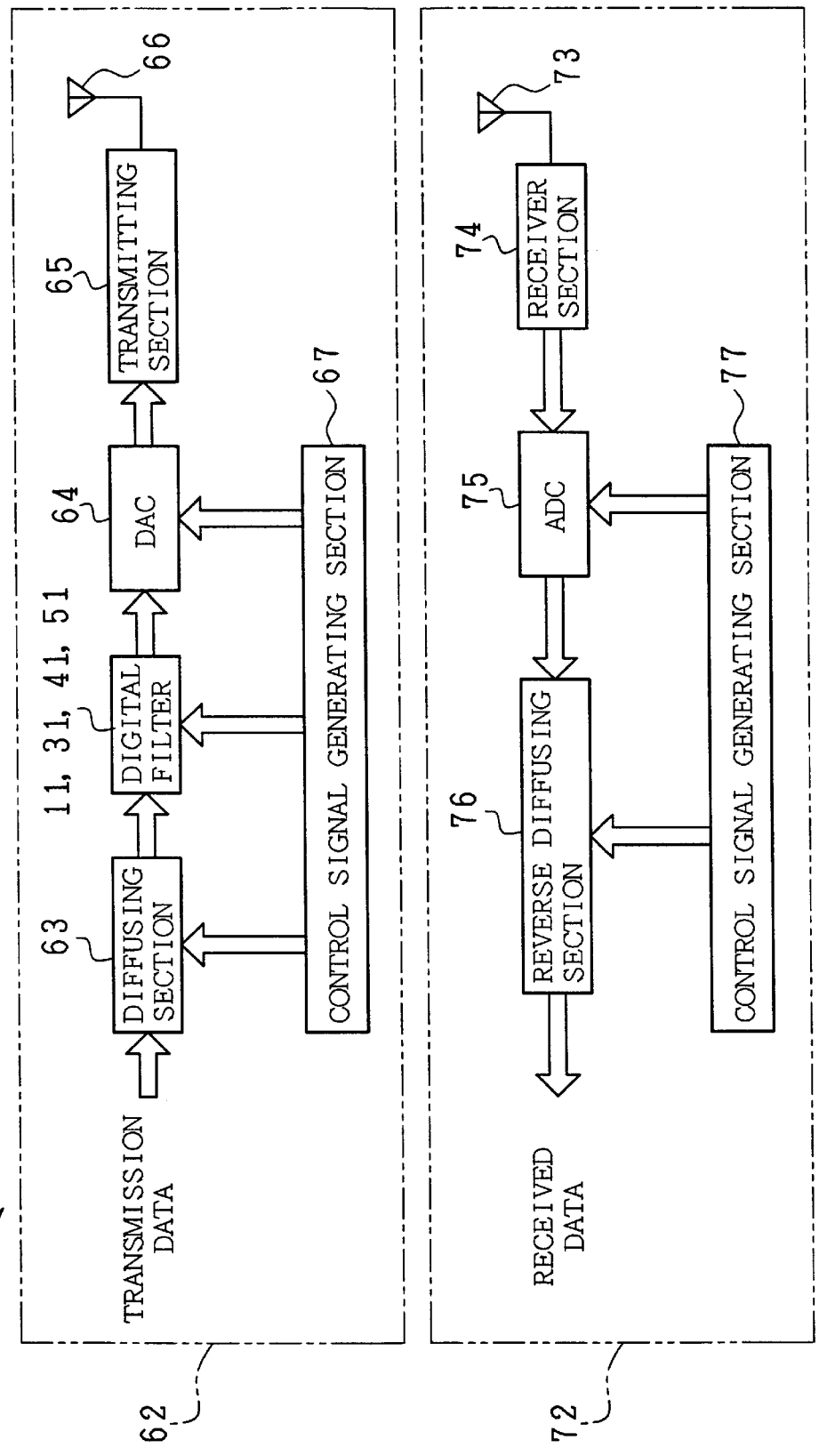
FIG. 11 is a block diagram schematically showing an arrangement of a wireless communication device as an example application of the digital filter shown in any of FIGS. 1 through 10.
Figure 12A:
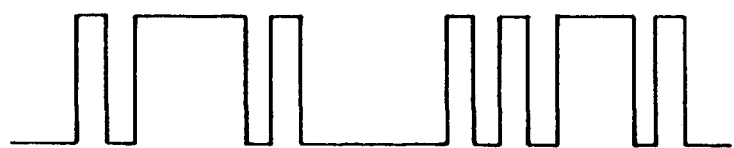
FIGS. 12(a) and 12(b) are views explaining spread of a sideband of a digital signal.
Figure 12B:
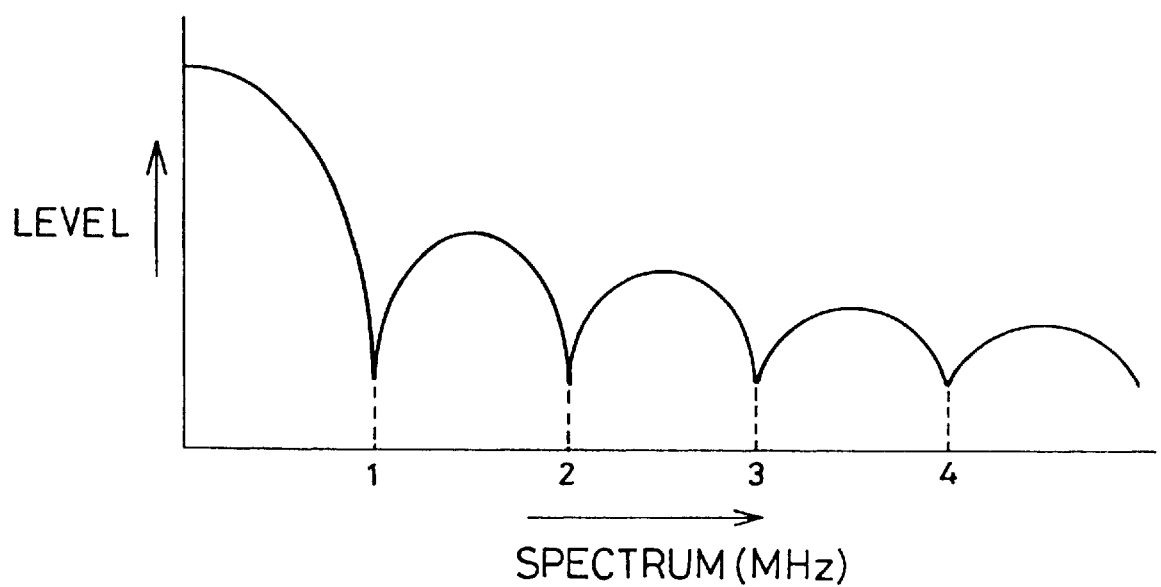
Figure 13:
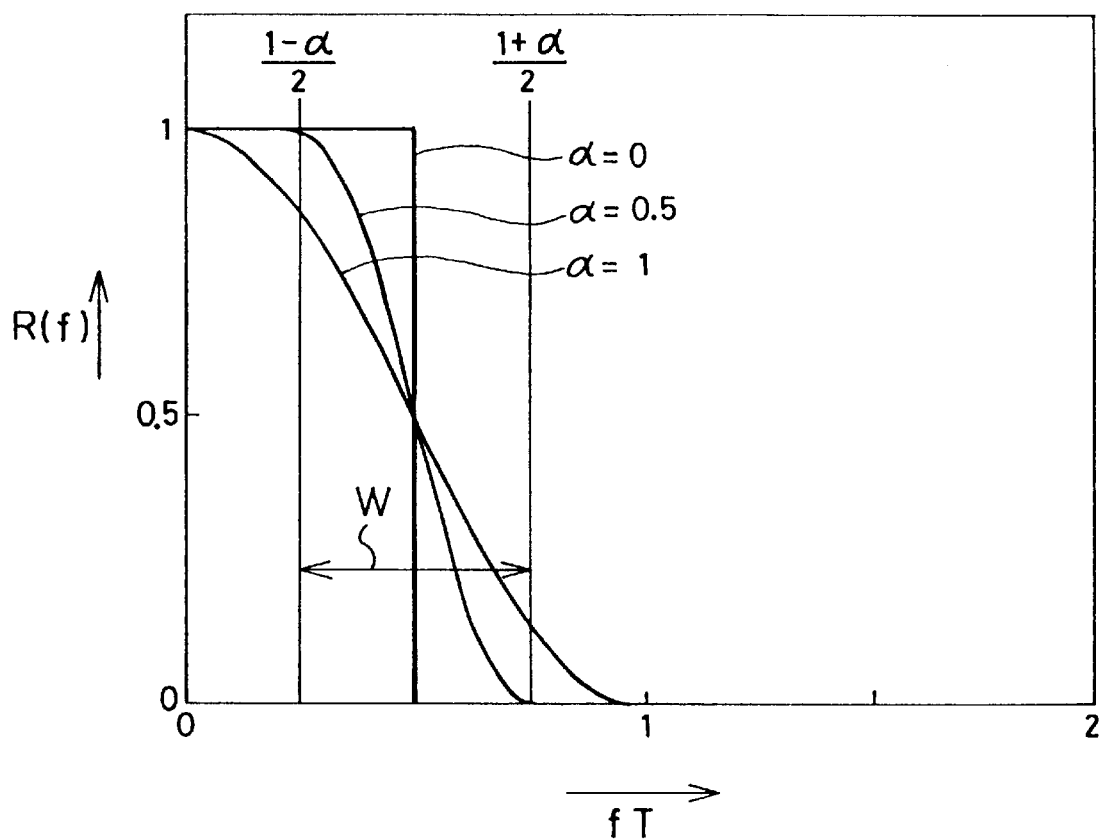
FIG. 13 is a graph explaining a transfer function of a roll-off filter.
Figure 14:
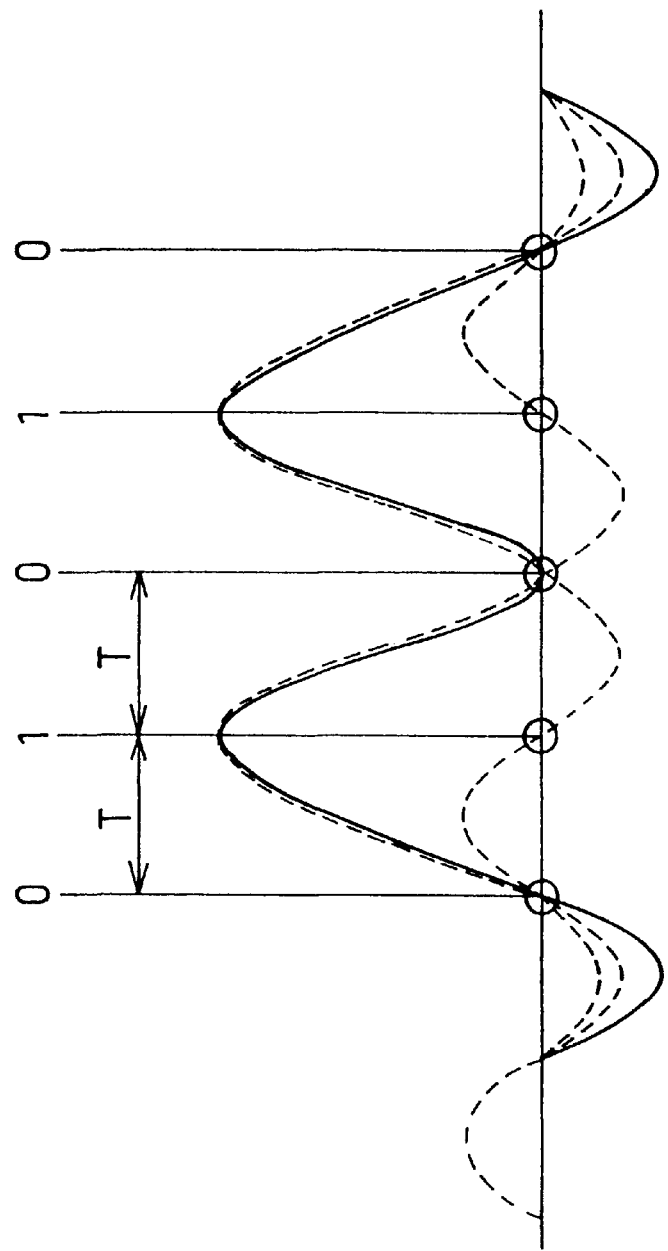
FIGS. 14(a) and 14(b) are views showing a waveform to explain an operation of the roll-off filter.

FIG. 11 is a block diagram schematically showing an arrangement of a wireless communication device 61 using the spectrum diffusion communication as an example application of the digital filters 11, 31, 41, and 51 respectively arranged in the above manners. In a transmitter device 62, transmission data are inputted into a diffusing section 63 and subjected to spectrum diffusion. Subsequently, the transmission data are inputted into the digital filter 11, 31, 41, or 51 of the present invention, so as to narrow the bandwidth of the spectrum. The output from the digital filter 11, 31, 41, or 51 is converted to an analog signal by a DAC (digital-to-analog converter) 64, and modulated by means of 36 QAM technique in a transmitting section 65, for example. Further, the output is amplified and transmitted from an antenna 66. The actions of the diffusing section 63, digital filter 11, 31, 41, or 51, DAC 64, etc. are controlled by a clock signal from a control signal generating section 67.

In a receiver device 72, a received signal received by an antenna 73 is amplified and decoded by a receiver section 74. A decoded signal is converted into a digital signal by a ADC (analog-to-digital converter) 75, and subjected to reverse diffusion by a reverse diffusing section 76. Consequently, the received signal is decoded to received data which are true to the transmission data without any intersymbol interference. The actions of the ADC 75, reverse diffusing section 76, etc. are controlled by a clock signal from the control signal generating section 77.

The wireless communication device 61 adopting such spectrum diffusion communication uses a frequency bandwidth broader than that of the transmission data due to diffusion. However, by using the digital filter 11, 31, 41, or 51 of the present invention, the bandwidth can be narrowed while removing unwanted sideband component in the diffusion signal without causing intersymbol interference. Consequently, even when the frequency bandwidth is limited, a large number of channels can be secured by means of frequency multiplexing, thereby utilizing the frequency bandwidth efficiently.

The wireless communication device 61 demands a great number of circuits for digital signal processing, such as diffusion processing and reverse diffusion processing. However, the digital filter 11, 31, 41, or 51 of the present invention can downsize the circuit by omitting some of the multipliers G from an FIR type filter, which otherwise would be readily upsized, by exploiting the impulse response characteristics of the roll-off filter. Thus, the resulting digital filter can be incorporated as an integral part into an LSI which conducts digital signal processing. Consequently, it has become possible to provide a smaller and lighter digital filter which can save the power consumption and costs and shorten the development period.

Figure 15:
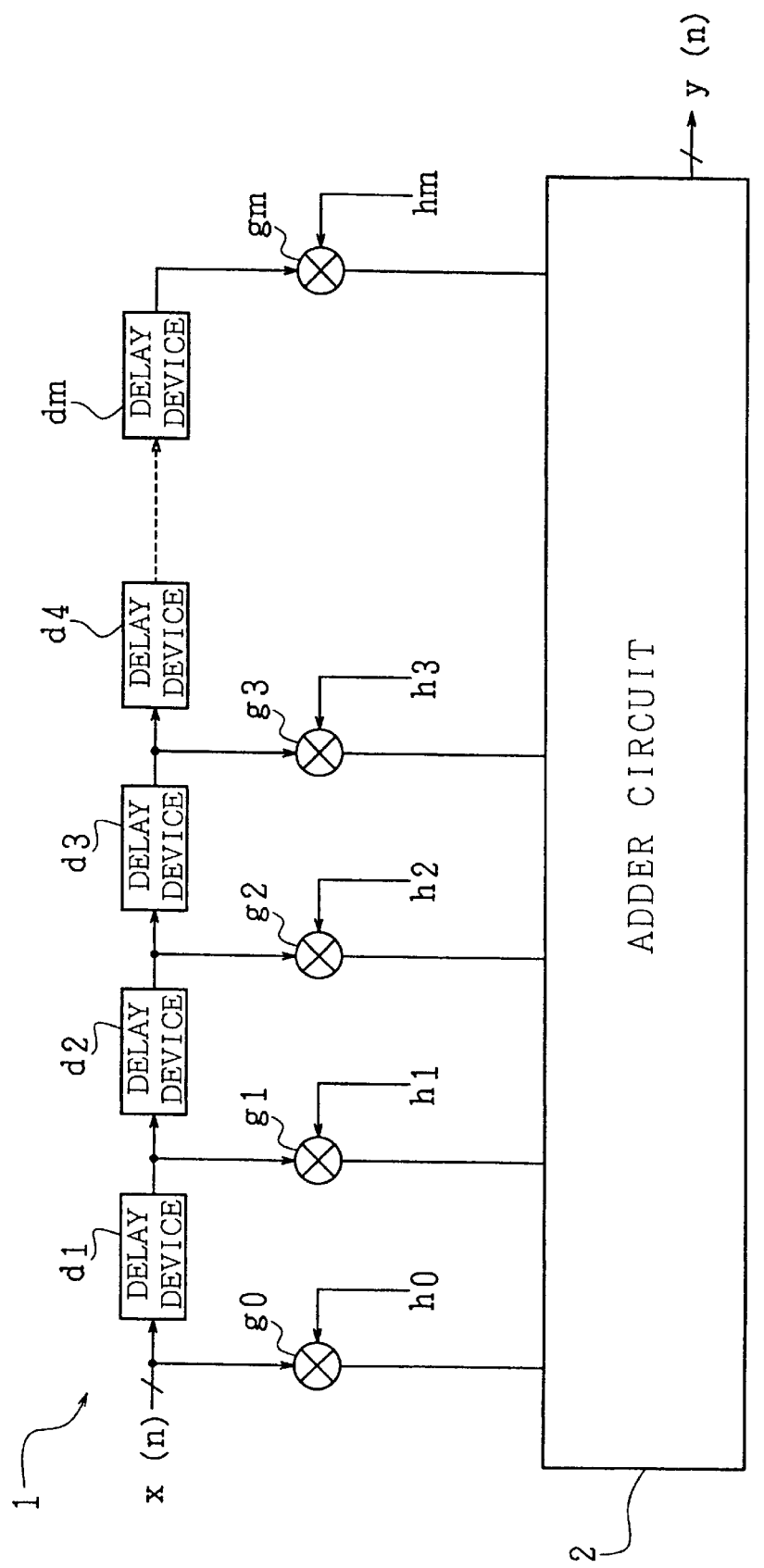
FIG. 15 is a block diagram depicting an electrical arrangement of a typical conventional digital filter.

Japanese Laid-open Patent Application No. 46096/1994 (Japanese Official Gazette, Tokukaihei No. 6-46096, published on Feb. 18, 1994) discloses a good example prior art to remove the unwanted sideband components using a digital filter. However, the technical art disclosed therein relates to a quadrature detector, and a memory is used only for weighting (equivalent to the coefficients of the present invention) in a running average filter (the filter identical with the one shown in FIG. 15 of the present invention). Hence, the input data are merely weighted by the memory, and if the data are delivered sequentially through the delay devices, the data remain intact as the resulting multiplied value outputted from the memory. Hence, this prior art is totally irrelevant to the present invention in which the output from each tap is multiplied by an arbitrary coefficient.

As has been discussed, the digital filter of the present invention is an FIR type digital filter realized by the following arrangement. That is, given that N is an oversampling multiple and N·fs is a frequency of the transfer clock of each delay means, then the input data are inputted for a 1/N period of the sign interval T of the input data and "0" is inputted for the rest of the period as the input, data, so that even when the input data shape a rectangle wave pulse, a resulting state becomes identical with the one when an impulse train is inputted, and therefore, the impulse response characteristics of the roll-off filter can be utilized. Given these conditions, the digital filter of the present invention can be realized by assembling a roll-off filter with optimal characteristics by adding the outputs from each pair of taps supplied with the same coefficient due to symmetry of the impulse response characteristics, and multiplying each addition result with the coefficient.

With a non-cyclic (FIR) type digital filter, the multiplying coefficients computed by Equation (2) above are those obtained in a case where an impulse train is the input data.

In contrast, the practical input data shape a rectangle wave pulse, such as an NRZ (Non Return to Zero) pulse train, and in an actual filter, the transfer function of Equation (1) above is multiplied with a reciprocal of sinc(fT), namely, πfT/sin (πfT), to obtain the waveform response of Equation (2) above. However, if the input data are inputted for a 1/N period of the sign interval T of the input data and "0" are inputted for the rest of the period as the input data in the above manner, even when the input data shape the rectangular wave pulse, a resulting state is identical with the one when an impulse train is inputted. Hence, since the impulse response characteristics of the roll-off filter can be utilized, a roll-off filter with optimal characteristics can be realized with an arrangement such that outputs from each pair of taps supplied with the same coefficient due to symmetry of the impulse response characteristics are added to each other, and each addition result is multiplied with their respective coefficients.

To be more specific, the data obtained by computation (as an interpolation sample) are inserted into actual input data for each sign interval T in the following manner. That is, from the impulse response characteristics of the roll-off filter of FIG. 2, coefficients are computed, which correspond to the impulse response levels at a desired roll-off ratio at the sampling cycle normalized with the sign interval, t/T (t: sampling cycle, T:sign interval). For example, t/T=±0.5, ±1.5, . . . when N=2, and t/T=±0.33, ±0.67, ±1.33, ±1.67, . . . when N=3. The coefficients thus computed are used as multiplying coefficients for the taps symmetrically corresponding to the t/T values with respect to the tap from which non-interpolated actual input data are taken out. Then, the outputs from each pair of the taps supplied with the same multiplying coefficient are added to each other, and each sum is multiplied with their respective multiplying coefficients.

Consequently, since the number of elements, particularly the number of elements forming the multipliers, can be reduced, the number of components can be reduced, and the costs and power consumption can be saved while the developing period can be shortened. Accordingly, the digital filter arranged in the above manner can be suitably used for a data communication device adopting the spectrum diffusion communication.

As has been discussed, another digital filter of the present invention omits a multiplier and an adder for the nN'th taps ahead and behind the tap from which the non-interpolated actual input data are taken out based on the fact that the coefficient for the nN'th taps is invariably "0" at any roll-off ratio.

According to the above arrangement, as can be understood from the impulse response characteristics of the roll-off filter set forth in FIG. 2, the coefficient is invariably "0" at any roll-off ratio for the nN'th taps ahead and behind the taps from which the actual input data at the timing t=0 are taken out (third, sixth, . . . , and N'th, taps when N=3; fourth, eighth, . . . taps, when N=4). Hence, the multipliers and adders for these taps can be omitted, thereby further reducing the number of elements.

As has been discussed, still another digital filter of the present invention replaces the adders, when the oversampling multiple N is an odd number, with changeover switches capable of switching to selectively output one of the outputs from two taps, based on the fact that, for the taps other than the nN'th taps supplied with the "0" coefficient, the output data are "0" at least at one of the two taps supplied with the same coefficient.

According to the above arrangement, when the oversampling multiple N is an odd number, the output from at least one of the taps supplied with the same coefficient is "0" for the taps other than the nN'th taps supplied with the "0" coefficient. Thus, for these taps, the addition processing is not necessary, so that the adder can be replaced with the changeover switch of a simple arrangement. Consequently, the arrangement can be further simplified.

As has been discussed, still another digital filter of the present invention replaces the adders, when the oversampling multiple N is an even number, with changeover switches capable of switching to selectively output one of the outputs from two taps, based on the fact that, for the taps other than the nN'th taps supplied with the "0" coefficient and the nN/2'th taps, the output data are "0" at least at one of the two taps supplied with the same coefficient.

According to the above arrangement, when the oversampling multiple N is an even number, the output from at least one of the taps which are multiplied with the same coefficient is "0" for the taps other than the nN'th taps supplied with the "0" coefficient and the nN/2'th taps (second, fourth, sixth, eighth, . . . taps, when N=4). Thus, for, these taps, the addition processing is not necessary, so that the adder can be replaced with the changeover switch of a simple arrangement. Consequently, the arrangement can be further simplified.

As has been discussed, still another digital filter of the present invention controls the switching action of the changeover switch by switching control means, which monitors an output from one of the taps supplied with the same coefficient, and makes the changeover switch output the output from the tap which has been monitored when the monitored output is not "0", and an output from the other tap otherwise.

According to the above arrangement, the switching control means controlling the changeover switch can be realized by a simple arrangement, such as a NOR gate having as many input terminals as bits from all the taps.

As has been discussed, still another digital filter of the present invention converts the input data into a predetermined code or number by encoding means when the input data are a specific kind of data which take a plurality of predetermined values alone, and decodes the code or number of the output data to the data of the same format as that of the input data.

According to the above arrangement, when the input data are a specific kind of data which take only a plurality of predetermined amplitude levels (for example, 6 different digital converted values for a signal modulated by means of 64 QAM technique), the amplitude level inputted as the input data is converted to a code or a number by the encoding means at a preceding side of the delay means in the first stage, for example, at the preceding or succeeding stage of the input data converting means. Then, the filtered output data are converted to the data of the same format as that of the input data by the decoding means.

Thus, in case that the input data are the 36 QAM data represented by 8 bits, 6 different values are given as the amplitude levels and these values can be represented by a 3-bit code or number. Consequently, the number of elements can be reduced further.

With an arrangement such that realizes operational processing, which is simpler and faster than an operation using a computer, by reading out the store data from an address area designated by the input data used as the address data from the ROM table, reducing the number of bits of the input data in the above manner is preferable because a capacity of the ROM can be reduced drastically. Consequently, compared with the input data, the number of bits of the data subject to filtering can be reduced, thereby further reducing the number of elements.

As has been discussed, still another digital filter of the present invention outputs the actual input data only through a changeover switch which outputs the actual input data after the interpolation data are inserted therein, based on the fact that the tap from which the non-interpolated actual input data are taken out is invariably multiplied with the "1" coefficient which is not added with any other coefficient.

According to the above arrangement, since the tap from which the non-interpolated actual input data at the timing t=0 are taken out is invariably multiplied with the "1" coefficient which is not added to any other coefficient, the multiplier and adder can be omitted.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A digital filter comprising:
   delay means, cascaded in multiple stages and each having a tap, for sequentially delaying actual input data;
   a plurality of first adding means for adding up outputs from the taps supplied with a same multiplying coefficient among multiplying coefficients used to multiply an output from each tap;
   a plurality of multiplying means for multiplying an output from each of said first adding means with their respective multiplying coefficients;
   second adding means for adding up multiplication results from each of said multiplying means and outputting an addition result as interpolation data;
   input data converting means for receiving a transfer clock having a frequency of N·fs, and converting the actual input data in such a manner that the actual input data are outputted to said delay means for a 1/N period of a sign interval T of the actual input data and "0" is outputted to said delay means for a remaining period, where N is a multiple of oversampling conducted by computing the interpolation data from the actual input data obtained by sampling the actual input data for each sign interval T, and subsequently inserting the interpolation data into the actual input data, and fs represents a sampling frequency of input data;
   switching control means for outputting a switching control signal based on an output from the tap from which the actual input data are taken out;
   switching means for switching to selectively output one of the interpolation data outputted from said second adding means and the actual input data outputted from the tap,
   wherein the switching control means is a NOR circuit which outputs a result of a NOR operation as said switching control signal; and
   said switching means outputs the interpolation data when said switching control signal is "1", and the actual input data when said switching control signal is "0".

2. The digital filter of claim 1, wherein said input data converting means includes:
   a base N number counter which receives the transfer clock; and
   an AND circuit for conducting an AND operation of an output from said base N number counter and said input data, and outputting an operation result to said delay means as converted input data, said AND circuit outputting said input data for a period of T/N during which "1" is supplied from said base N counter to said AND circuit, and "0" for a remaining period.

3. The digital filter of claim 1, wherein said multiplying means and first adding means are omitted for the taps which are(nN)-th taps ahead and behind the tap from which the actual input data are taken out, wherein n is an integer.

4. The digital filter of claim 1, wherein, when the actual input data take a plurality of predetermined values alone, the actual input data are inputted into said input data converting means through encoding means which encodes the actual input data to one of a code and a number, said digital filter further comprising decoding means which decodes an output from said switching means to the actual input data.

5. The digital filter of claim 1, wherein the actual input data are outputted only through a changeover switch which outputs the actual input data while the interpolation data are inserted therein.

6. A digital filter comprising:
   delay means, cascaded in multiple stages and each having a tap, for sequentially delaying actual input data;
   a plurality of first adding means for adding up outputs from the taps supplied with a same multiplying coefficient among multiplying coefficients used to multiply an output from each tap;
   a plurality of multiplying means for multiplying an output from each of said first adding means with their respective multiplying coefficients;
   second adding means for adding up multiplication results from each of said multiplying means and outputting an addition result as interpolation data;
   input data converting means for receiving a transfer clock having a frequency of N·fs, and converting the actual input data in such a manner that the actual input data are outputted to said delay means for a 1/N period of a sign interval T of the actual input data and "0" is outputted to said delay means for a remaining period,
   where N is a multiple of oversampling conducted by computing the interpolation data from the actual input data obtained by sampling the actual input data for each sign interval T, and subsequently inserting the interpolation data into the actual input data, and fs represents a sampling frequency of input data;
   wherein said multiplying means and first adding means are omitted for the taps which are(nN)-th taps ahead and behind the tap from which the actual input data are taken out, wherein n is an integer,
   wherein, when said multiple N of the oversampling is an odd number, said first adding means associated with the taps other than said(nN)-th taps include:
      switching control means for outputting a switching control signal based on outputs from the taps; and
      switching means for switching to selectively output one of outputs from correlated two taps based on said switching control signal.

7. A digital filter comprising:
   delay means, cascaded in multiple stages and each having a tap, for sequentially delaying actual input data;
   a plurality of first adding means for adding up outputs from the taps supplied with a same multiplying coefficient among multiplying coefficients used to multiply an output from each tap;

a plurality of multiplying means for multiplying an output from each of said first adding means with their respective multiplying coefficients;

second adding means for adding up multiplication results from each of said multiplying means and outputting an addition result as interpolation data;

input data converting means for receiving a transfer clock having a frequency of N·fs, and converting the actual input data in such a manner that the actual input data are outputted to said delay means for a 1/N period of a sign interval T of the actual input data and "0" is outputted to said delay means for a remaining period, where N is a multiple of oversampling conducted by computing the interpolation data from the actual input data obtained by sampling the actual input data for each sign interval T, and subsequently inserting the interpolation data into the actual input data, and fs represents a sampling frequency of input data;

wherein said multiplying means and first adding means are omitted for the taps which are(nN)-th taps ahead and behind the tap from which the actual input data are taken out, wherein n is an integer, wherein, when said multiple N of the oversampling is an even number, said first adding means associated with the taps other than said(nN)-th taps and (nN/2)-th taps include:
  switching control means for outputting a switching control signal based on outputs from the taps; and
  switching means for switching to selectively output one of outputs from correlated two taps based on said switching control signal.

8. The digital filter of claim 6, wherein:

said switching control means is a NOR circuit which outputs a result of a NOR operation as said switching control signal; and said switching control means monitors as output from one of two taps supplied with the same coefficient, and controls said switching means to output the output from the tap which has been monitored when the output which has been monitored is not "0", and controls said switching means to output an output from the other tap when the output which has been monitored is "0".

9. The digital filter of claim 7, wherein:

said switching control means is a NOR circuit which outputs a result of a NOR operation as said switching control signal; and said switching control means monitors as output from one of two taps supplied with the same coefficient, and controls said switching means to output the output from the tap which has been monitored when the output which has been monitored is not "0", and controls said switching means to output an output from the other tap when the output which has been monitored is "0".

10. A non-cyclic digital filter for obtaining filtering data by (1) sequentially delaying input data by delay means cascaded in multiple stages and each equipped with a tap, (2) multiplying an output from each tap with a predetermined coefficient, and (3) adding up multiplication results and outputting an addition result as interpolation data, comprising:
  input data converting means for inputting input data to said delay means for 1/N period of a sign interval T of the input data and inputting "0" as the input data for a remaining period, where N is a oversampling multiple and N·fs is a frequency of a transfer clock of each of said delay means with respect to a sampling frequency fs of the input data;
  encoding means, provided on a preceding stage side of the delay means in a first stage, for encoding an information data into one, of predetermined code and number as the input data when the information data are a specific kind of data which take a plurality of predetermined values alone;
  switching control means for outputting a switching control signal based on an output from the tap from which the input data are taken out;
  switching means for switching to selectively output one of the interpolation data and the input data outputted from the tap;
  said switching means outputting the interpolation data when said switching control signal is "1", and the input data when said switching control signal is "0"; and
  decoding means for decoding said one of code and number of an output data from said switching means into data of a format identical with a format of the information data.

11. The digital filter of claim 10, wherein a multiplier and an adder are omitted for the taps which are(nN)-th (n is an integer) taps ahead and behind the tap from which non-interpolation actual input data are taken out.

12. The digital filter of claim 10, wherein non-interpolated actual input data are outputted only through a changeover switch which outputs the actual input data while interpolation data are inserted therein.

13. The digital filter of claim 10, wherein said switching control means is a NOR circuit which outputs a result of a NOR operation as said switching control signal.

14. A non-cyclic digital filter for obtaining filtering data by (1) sequentially delaying input data by delay means cascaded in multiple stages and each equipped with a tap, (2) multiplying an output from each tap with a predetermined coefficient, and (3) adding up multiplication results, comprising:
  input data converting means for inputting input data to said delay means for 1/N period of a sign interval T of the input data and inputting "0" as the input data for a remaining period, where N is a oversampling multiple and N·fs is a frequency of a transfer clock of each of said delay means with respect to a sampling frequency fs of the input data
  wherein a multiplier and an adder are omitted for the taps which are(nN)-th (n is an integer) taps ahead and behind the tap from which non-interpolation actual input data are taken out,
  wherein, when the over sampling multiple N is an odd number, the adders associated with the taps other than said(nN)-th taps are replaced with changeover switches capable of switching to selectively output one of outputs from two taps.

15. A non-cyclic digital filter for obtaining filtering data by (1) sequentially delaying input data by delay means cascaded in multiple stages and each equipped with a tap, (2) multiplying an output from each tap with a predetermined coefficient, and (3) adding up multiplication results, comprising:
  input data converting means for inputting input data to said delay means for 1/N period of a sign interval T of the input data and inputting "0" as the input data for a remaining period, where N is a oversampling multiple and N·fs is a frequency of a transfer clock of each of said delay means with respect to a sampling frequency fs of the input data wherein a multiplier and an adder are omitted for the taps which are(nN)-th (n is an integer) taps ahead and behind the tap from which non-interpolation actual input data are taken out, wherein, when the oversampling multiple N is an even number, the adders associated with the taps other than said(nN)-th taps and(nN/2)-th taps are replaced with changeover switches capable of switching to selectively output one of outputs from two taps.

16. The digital filter of claim 14 or 15, further comprising switching control means which monitors an output from one of two taps supplied with the same coefficient, and controls said changeover switches to output the output from the tap which has been monitored when the output which has been monitored is not "0", and controls said changeover switch to output an output from the other tap when the output which has been monitored is "0".

* * * * *